(12) United States Patent
Feng et al.

(10) Patent No.: US 8,159,287 B2
(45) Date of Patent: Apr. 17, 2012

(54) TRANSISTOR DEVICE AND METHOD

(75) Inventors: Milton Feng, Champaign, IL (US); Nick Holonyak, Jr., Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 226 days.

(21) Appl. No.: 12/287,713

(22) Filed: Oct. 10, 2008

(65) Prior Publication Data

US 2009/0134939 A1    May 28, 2009

Related U.S. Application Data

(60) Provisional application No. 60/998,651, filed on Oct. 12, 2007.

(51) Int. Cl.
*H03F 3/04* (2006.01)
*H01L 29/66* (2006.01)
*H01L 21/331* (2006.01)

(52) U.S. Cl. .................. 327/581; 257/24; 257/E29.168; 257/E21.371; 438/478

(58) Field of Classification Search .................... 257/24, 257/197, 232, 565, E33, E29.168, E29.104, 257/E29.193, E21.066, E21.371; 438/478, 438/590, 235, 309, 312; 327/581; 372/43.01
See application file for complete search history.

(56) References Cited

U.S. PATENT DOCUMENTS

| | | | | |
|---|---|---|---|---|
| 5,274,266 A * | 12/1993 | Tews et al. | ..................... | 257/592 |
| 5,293,084 A | 3/1994 | Itoh et al. | ..................... | 307/446 |
| 5,840,612 A | 11/1998 | Oki et al. | ..................... | 438/312 |
| 2004/0195597 A1* | 10/2004 | Torvik et al. | ..................... | 257/232 |
| 2005/0090051 A1* | 4/2005 | Yi | ..................... | 438/202 |
| 2006/0065952 A1* | 3/2006 | Boos et al. | ..................... | 257/565 |
| 2007/0090399 A1* | 4/2007 | Chin et al. | ..................... | 257/197 |
| 2007/0201523 A1* | 8/2007 | Walter et al. | ..................... | 372/43.01 |

FOREIGN PATENT DOCUMENTS

JP    2005109368    4/2005

OTHER PUBLICATIONS

Ito et al., Evaluation of base transit time in ultra-thin carbon-doped base InP/InGaAs heterojunction bipolar transistors, Jul. 18, 1996, Electronics Letters, vol. 32 p. 1413-1414.*
"HFET Transistors With Outstanding Performance And Durability", pp. 135-138, Microwave Journal, Jun. 2007.

* cited by examiner

*Primary Examiner* — Victor A Mandala
*Assistant Examiner* — Whitney T Moore
(74) *Attorney, Agent, or Firm* — Martin Novack

(57) ABSTRACT

A field-effect transistor device, including: a semiconductor heterostructure comprising, in a vertically stacked configuration, a semiconductor gate layer between semiconductor source and drain layers, the layers being separated by heterosteps; the gate layer having a thickness of less than about 100 Angstroms; and source, gate, and drain electrodes respectively coupled with said source, gate, and drain layers. Separation of the gate by heterosteps, rather than an oxide layer, has very substantial advantages.

28 Claims, 4 Drawing Sheets

TRANSISTOR DEVICE AND METHOD

PRIORITY CLAIM

Priority is claimed from U.S. Provisional Patent Application No. 60/998,651, filed Oct. 12, 2007, and said U.S. Provisional Patent Application is incorporated herein by reference.

FIELD OF THE INVENTION

This invention relates to transistor devices and methods, including improvements in field-effect transistor devices and methods and heterojunction bipolar transistor devices and methods.

BACKGROUND OF THE INVENTION

Based on silicon metal oxide semiconductor field effect transistor (Si MOSFET) transistor scaling and the so-called research roadmap, the 15 nm node (physical gate length, <7 nm) of Si complementary metal oxide semiconductor (CMOS) will reach a fundamental limitation and will have no significant performance advancement over the larger 22 nm node version due to limitations of mobility and sheet carrier density. To improve the n-MOSFET performance beyond the 15 nm node requires an electron mobility >2000 cm$^2$N-s with a sheet electron density >$8 \times 10^{12}$ cm$^{-2}$. Silicon researchers have employed strain in the Si and SiGe channel for mobility enhancement as well as non-planar double gate (FINFET) and non-planar tri-gate methods for sheet carrier improvement. However, all the above mentioned methods of enhancement have failed to meet the requirement of a 15 nm Si CMOS node.

The field effect transistor (FET) is a majority carrier device transferring carriers (typically electrons) from a source to a drain with an applied gate voltage on a reverse-biased junction (between source and drain) modulating the conductivity of the source-to-drain FET channel. Fundamental FET operation is based on the ability of the capacitance charging and discharging process on the gate determining the channel modulation speed.

For example, FIG. 1 represents a MOSFET with gate scaling (lateral size) below 20 nm and an oxide thickness under the gate smaller (thinner) than 5 nm. There are numerous issues and limitations concerning the FET, related to breakdown voltage, output conductance, and gate leakage current due to tunneling through the thin gate oxide.

It is among the objects of the present invention to provide solution to the above-describe types of prior art problems and limitations, and to provide improved transistor devices and techniques.

SUMMARY OF THE INVENTION

An aspect of the invention relates to a field-effect transistor device, including: a semiconductor heterostructure comprising, in a vertically stacked configuration, a semiconductor gate layer between semiconductor source and drain layers, said layers being separated by heterosteps; said gate layer having a thickness of less than about 100 Angstroms; and source, gate, and drain electrodes respectively coupled with said source, gate, and drain layers. As will be described further herein, separation of the gate by heterosteps, rather than an oxide layer, has very substantial advantages.

In accordance with a form of the invention, a heterojunction bipolar transistor device is set forth for operation as a field-effect transistor device which is responsive to an input voltage for application to a base/gate terminal to control current flow between an emitter/source terminal and a collector/drain terminal, comprising: a layered semiconductor heterojunction structure including a base/gate layer of a first semiconductor type disposed between an emitter/source layer of a second semiconductor type and a collector/drain layer of said second semiconductor type; the emitter/source layer comprising a higher bandgap material than said base/gate layer; the base/gate layer having a thickness of less than about 100 Angstroms; an emitter/source terminal coupled with the emitter/source layer, a base/gate terminal coupled with the base/gate layer, and a collector/drain terminal coupled with the collector/drain layer; whereby, application of said input voltage to said base/gate terminal is operative to control current flow between said emitter/source and said collector/drain.

The layered semiconductor heterojunction structure of this form of the invention preferably has the construction of a vertical stack of layers on a semiconductor substrate. In a preferred embodiment of this form of the invention, the input voltage is an AC voltage, and the input impedance to the base/gate terminal has a relatively very high resistive component as compared to its reactive component at the operating frequency of said AC voltage. The resistive component is preferably at least an order of magnitude greater than the reactive component at the frequency of said AC voltage. Preferably, the base/gate layer is highly doped, such as to a doping concentration of at least $10^{19}$/cm$^3$.

In accordance with another form of the invention, a method is set forth for operating a transistor device as a field-effect transistor device which is responsive to an input voltage for application to a base/gate terminal to control current flow between an emitter/source terminal and a collector/drain terminal, comprising the following steps: providing a layered semiconductor heterojunction structure including a base/gate layer of a first semiconductor type disposed between an emitter/source layer of a second semiconductor type and a collector/drain layer of said second semiconductor type; said emitter/source layer comprising a higher bandgap material than said base/gate layer; and said base/gate layer having a thickness of less than about 100 Angstroms; providing an emitter/source terminal coupled with said emitter/source layer, a base/gate terminal coupled with said base/gate layer, and a collector/drain terminal coupled with said collector/drain layer; and applying said input voltage to said base/gate terminal to control current flow between said emitter/source and said collector/drain.

In a preferred embodiment of this form of the invention, the step of providing a layered semiconductor heterojunction structure comprises depositing a vertical stack of layers on a semiconductor substrate. Also in a preferred embodiment, the step of applying an input voltage to said base/gate terminal comprises applying an AC voltage, and further comprises providing said base/gate layer such that the input impedance to said base/gate terminal has a relatively very high resistive component as compared to its reactive component at the frequency of said AC voltage. Operation can be at very high frequencies of at least 100 GHz, and as high as the Terahertz (THz) range or more.

Further features and advantages of the invention will become more readily apparent from the following detailed description when taken in conjunction with the accompanying drawings.

DETAILED DESCRIPTION

In accordance with an aspect hereof, an improved FET lies in the implementation of a vertical HFET evolving from an HBT in which there is provided, inter alia, an ultra thin base layer, almost complete transfer of emitter current to the collector with little or no base "loss" or recombination. The HBT ceases functioning as a classical bipolar transistor, and substantially crosses over to functioning as a field effect "transistor", i.e., as a majority carrier (unipolar) device, Among the objectives hereof are establishing a technique and device which constitute an "HBT" version of a vertical FET, and employing to advantage the fact that, with this approach, extremely small dimensions can be realized between the source and drain (and, in, addition useful heterojunction energy gap steps can be incorporated in the layer stacking from emitter-source to collector-drain).

It can be observed that a conventional FET has another technological limitation; namely, the weakness of stacking of dissimilar materials, i.e., oxide on Si semiconductor, and thus peculiar interface problems. This is not true for III-V heterojunction bipolar (or, herein, improved field effect) transistors where there is lattice structure (crystal) continuity across layer to layer—just desirable band-gap (potential steps) from layer-to-layer, and without structural disruptions (lattice interruptions).

The bipolar junction transistor (BJT) or heterojunction bipolar transistor (HBT) is a minority carrier device, with the base current supporting (supplying): (a) base-region carrier recombination, (b) an emitter-base capacitance charging time, and (c) a base-collector charging time. In normal HBT (or BJT) operation, both of the capacitance charging times are relatively small and neglected. However, in very high speed operation, the HBT requires both vertical scaling of the layer structure (extreme thinness) and lateral scaling of the dimensions. It is then that the BE and BC junction capacitance charging times become significant in comparison to the base carrier transit time (or the carrier recombination time) and collector transit time (the time for the carrier to be collected).

For a very thin base layer in an HBT (or BJT), the base current basically provides junction capacitance charge (stored charge) instead of feeding the base recombination process or base charge storage capacitance. Hence, it is possible that the base transit time can be smaller than the capacitance charging time. The HBT can have a very high beta (current gain) and operate in similar fashion to an FET (i.e., with little or no base current or negligible recombination). The thin base then acts as a "gate", not a recombination layer.

Figure 1:
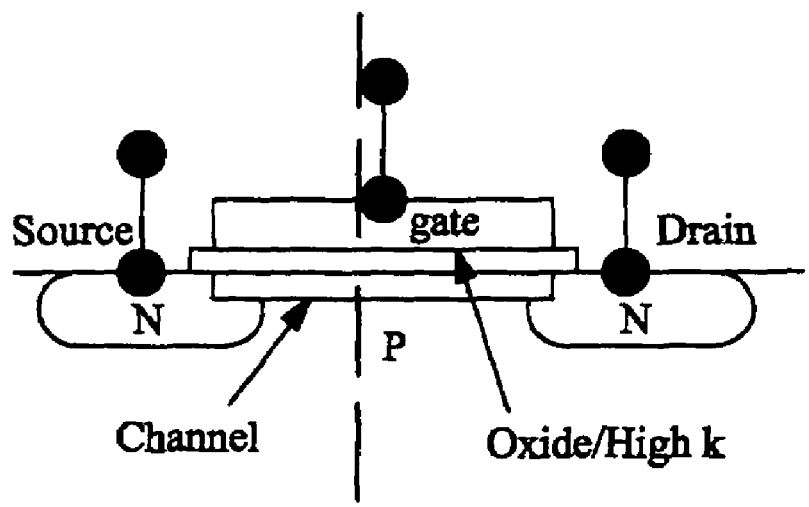
FIG. 1 is a schematic diagram, not to scale, of a prior art metal oxide semiconductor field effect transistor.
Figure 2:
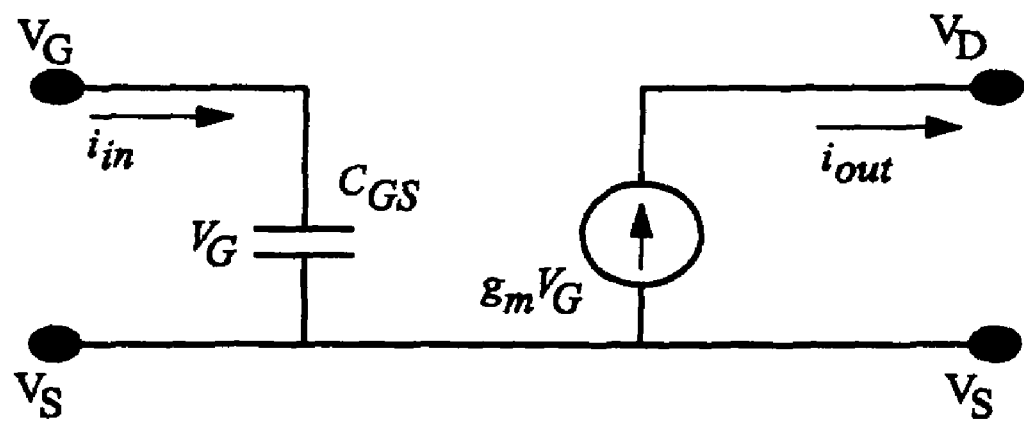
FIG. 2 is a circuit model for the FIG. 1 device.

Referring again now to the conventional FET device of FIG. 1, and to the circuit model for the FIG. 1 device, as shown in FIG. 2. The following equation (1) first conventionally expresses the output current, $i_{out}$, as a function of the gate voltage $V_G$ and the transconductance $g_m$, but then also (as the last term) as a function of the input current $i_{in}$, the charging capacitance $C_{GS}$, and the operating frequency $\omega$.

$$i_{out} = g_m v_G = g_m i_{in}\left(\frac{1}{j\omega C_{GS}}\right) \quad (1)$$

Then, the following equation (2) defines a gain, $\beta$ (usually, expressed for a bipolar transistor), first as the conventional ratio of output current to input current, but then (in the last term), by substitution from equation (1), expresses $\beta$ as a function of transconductance, charging capacitance, and operating frequency.

$$\beta = \frac{i_{out}}{i_{in}} = g_m\left(\frac{1}{j\omega C_{GS}}\right) \quad (2)$$

Figure 3:
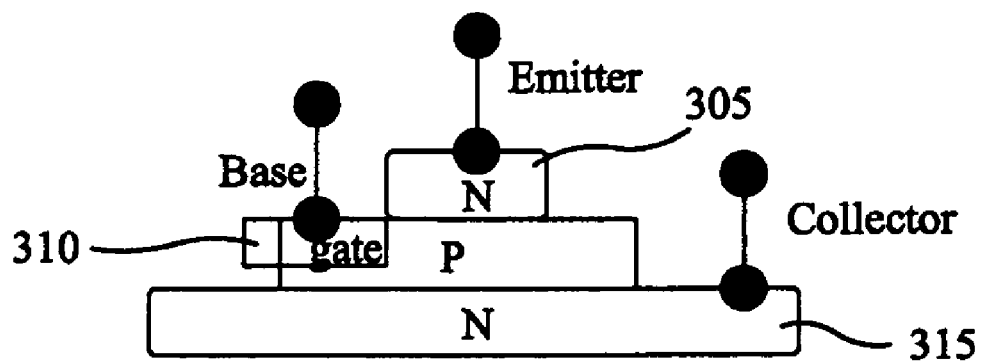
FIG. 3 is a diagram representing, functionally, a "hybrid" of bipolar transistor and field effect transistor.
Figure 4:
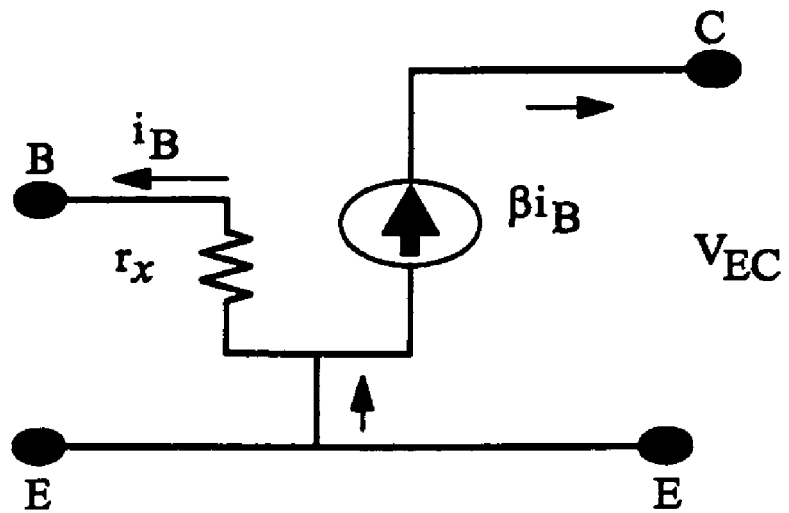
FIG. 4 is a circuit diagram of the FIG. 3 device.

FIG. 3 represents functionally, a "hybrid" of a bipolar junction transistor, with a base (gate) that is p-type, in this example, and part of the layered structure including emitter 305, base (gate) 310, and collector 315, each with an associated terminal. FIG. 4 is the circuit model for the device of FIG. 3. The gain, $\beta$, is expressed as $$\beta = \frac{\beta i_B}{i_B} = \frac{i_{out}}{i_{in}} = \frac{i_{out}}{\frac{v_{BE}}{r_\pi}} = g_m(r_\pi) \quad (3)$$

Figure 5:
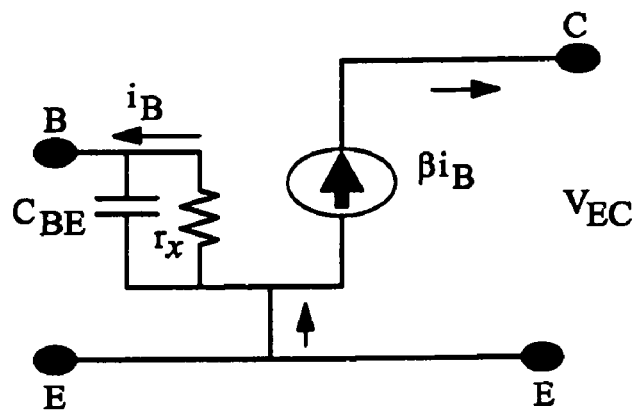
FIG. 5 is a circuit diagram of a heterojunction bipolar transistor with an ultra-thin base.

In this case, it is seen (in the last term) that $\beta$ can be expressed as a function of base resistance, $r_\pi$, and transconductance, $g_m$ (where $g_m = i_{out}/V_{BE}$). Then, in accordance with an aspect of the invention, and as represented in the circuit model of FIG. 5, the bipolar transistor is implemented as an HBT with an ultra-thin base (less than 100 Angstroms, in this example). In this case, the base current supports charging and discharging of the junction capacitance ($C_{BE}$ in the Figure) rather than feeding the base recombination process with any significant injected carriers from the emitter. If the input impedance is very large, so that $r_\pi$ approaches infinity, then the "transition" from bipolar junction transistor to field effect transistor is essentially effected; that is:

$$\beta = \frac{i_{out}}{i_{in}} = \frac{i_{out}}{\frac{v_{in}}{Z_{in}}} = g_m\left(\frac{1}{\frac{1}{r_\pi} + j\omega C_{BE}}\right) \approx g_m\left(\frac{1}{j\omega C_{BE}}\right) \quad (4)$$

Thus, in accordance with an embodiment of the invention, there is provided a vertical heterojunction field effect transistor (VHFET) with features including an ultra thin base layer HBT structure, an n-p-n for an n-channel VHFET and a p-n-p for a p-channel VHFET. An embodiment has the base (gate) layer thickness <10 nm (<100 Angstroms) and the collector thickness <50 nm. The base (gate) layer is highly doped, such as to a doping concentration of at least $10^{19}/cm^3$. With a wider energy gap emitter for hot carrier injection, a very high beta (>300) is possible and cross over from HBT operation to base charging (and discharging) and consequently FET operation (in essence all the "source" injection current transporting to the collector which now acts as an FET drain). It can be noted that there is still another advantage, as follows: the heterojunction at the emitter (now source, $\beta$>300) and at the collector (now drain) supports more voltage than a severely shrunk (and consequently leaking) conventional MOSFET. Preferred embodiments of the invention comprise a VHFET based on various HBT material systems with a thin base layer <10 nm and achieves beta >300 in both npn and pnp structures.

An aspect of the invention involves a VHFET using a wide gap emitter (source) and a small gap base (gate) (see e.g. FIG. 6) for hot carrier injection from the emitter (source) to the base for velocity overshoot through the base to achieve the required mobility (velocity) and charge carrier density. The base to collector junction can be used as the drain in a HFET. Since a 10 nm base HBT structure can be easily realized by MBE or MOCVD technology, further features hereof include the use of a graded base (both in composition and dopant) as well as incorporating quantum-wells (not separately shown) into the base to provide better hole mobility in the base transport process or for better recombination (when it is desired to introduce recombination and reduce β gain). In addition, thin barriers and thin wells can be included in the base tunneling through the base for fast transport between emitter to collector (or for purposes of improving lateral conductivity).

Figure 6A:
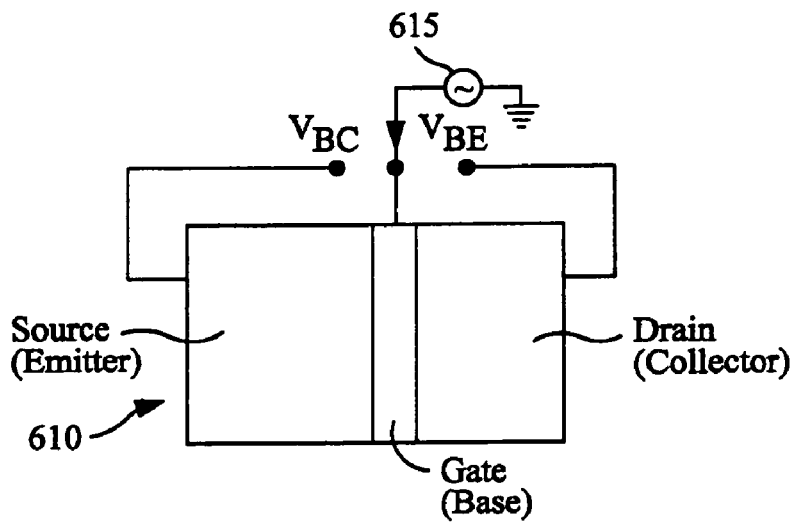
FIG. 6, A and B, show, respectively, a simplified diagram, on its side and not to scale, of a device in accordance with the principles hereof, and an energy band diagram of the device.
Figure 6B:
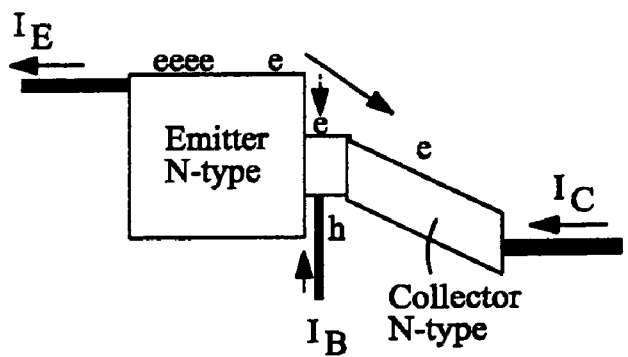

In accordance with an embodiment of the invention, as represented in FIGS. 6A and 6B, there is provided, for example, a type I SHBT or DHBT device 610, biased for normal operation with BE junction forward biased ($V_{BE}$) and BC junction reverse biased ($V_{BC}$), and with a relatively wider bandgap n-type emitter, a thin p-type base (<100 Angstroms, narrower bandgap), and with hot electrons injected from the emitter having a very low probability of recombining with holes in the base. Hence, the majority of injected electrons will be collected by the collector. In this case, the base current supplies holes for the charging and discharging of the BE and BC junction capacitances (not for recombination, $I_B$ (recomb) →0). The device acts as a vertical FET similar to the more familiar junction FET. Thus, an HBT structure has crossover in its behavior and is operating (for lack of base recombination) as a FET. The HBT geometry turns out to be of great value as an advantageous form of FET geometry. It is shrinkable to ultra small area and, for the reasons given, should allow much higher speed operation (and support more voltage).

In accordance with a further embodiment of the invention, there is provided a type II DHBT (see band diagram of FIG. 7), with both emitter and collector conduction band below the base conduction band. In this case, forward bias on the emitter/base junction will allow hot electron carrier injection and a thin p-type base (<100 Å) for an npn structure.

In accordance with another embodiment of the invention (see band diagram of FIG. 8), there is provided a type I Emitter/Base and type II Base/Collector HBT configuration. This is another choice for a VHFET, with an advantageous heterojunction form of "source" and "drain".

It will be understood that there are various material systems that can be used in implementing embodiments of the invention. For instance, for a GaAs platform, examples of suitable materials would be: emitter—InGaP, AlGaAs; base—GaAs, InGaAs; collector—GaAs, InGaAsP, InGaAs. For an InP platform, examples of suitable materials would be: emitter—InP or InGaAs; base—InGaAs, InGaAsP, GaAsSb, AlGaAsSb; collector—InP, InGaAs, InGaAsP. For a GaN platform, examples of suitable materials would be: emitter—GaN; base—InGaN; collector—GaN, InGaN.

As above noted, single or multiple quantum wells can be inserted in the base to enhance the hole transport property or to enhance the base contact conductivity, as well as to allow tunneling through the base quantum well for better transport.

Figure 7:
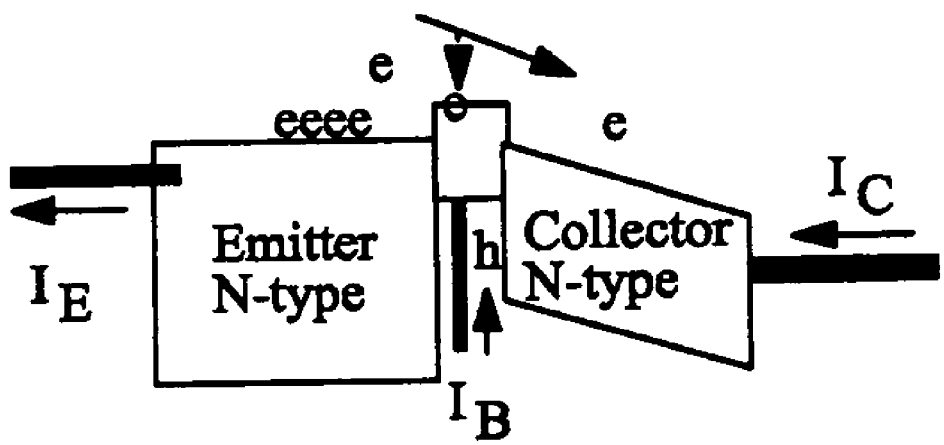
FIG. 7 is a band diagram of a device in accordance with another embodiment hereof.
Figure 8:
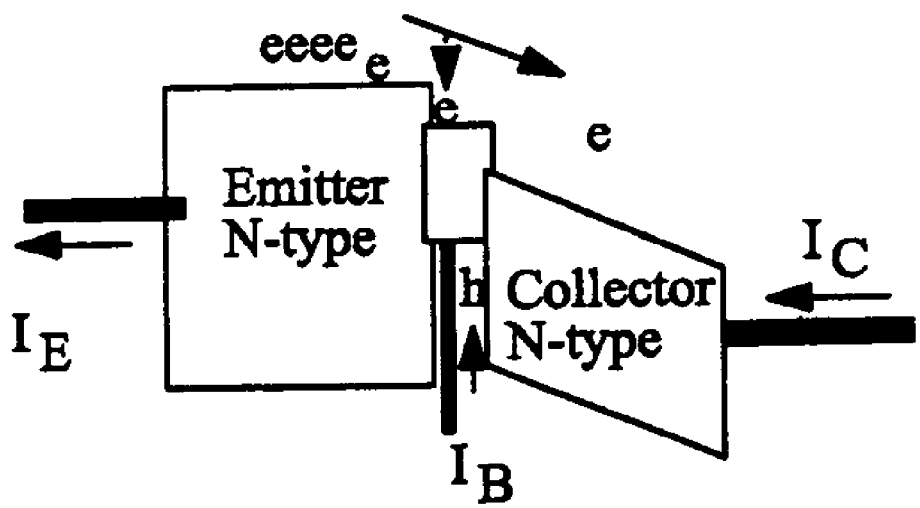
FIG. 8 is a band diagram of a device in accordance with still another embodiment hereof.

The exemplary embodiments illustrated in FIGS. 6 to 8 were described in terms of npn structures, but it will be understood that similar pnp structures are a part hereof, with similar hot-hole injection from the emitter, a suitable thin n-type base layer (<100 Å) type I and II with hole injection, hot-hole collection, and so-called bandgap engineering.

In summary, an aspect of the invention involves a vertical FET, an advantageous form of device geometry using an npn HBT and/or pnp HBT. These structures may become very important for ultra fast transistors because this configuration for an FET begins to look in behavior like a high speed HBT, i.e., the case β→infinity where base recombination becomes essentially base charging and discharging—and the special HBT hereof functions more like an FET than a classical HBT. In other words, the special HBT becomes an FET in function but now with an improved heterojunction source and an improved heterojunction drain (and thus less leakage and improved voltage capability). The VHFET using the thin base HBT is a significant advance for a nano-transistor structure meeting the requirement of a 15 nm node CMOS and for even smaller nodes.

An opposite aspect of the "transition" described in the foregoing can also be set forth. For an MOS Field Effect Transistor (MOSFET) with an "ultra-thin gate oxide" (<5 Å) the gate current not only provides charging and discharging of the junction capacitance but also provides gate tunneling current to the channel between the source and the drain. In this case, if the input resistance gets smaller, so that $r_\pi \Rightarrow 0$, then the transition MOSFET⇒BJT appears, as represented mathematically in the following equation (5)

$$\beta = \frac{i_{out}}{i_{in}} = \frac{g_m i_{in} Z_{in}}{i_{in}} = g_m \left( \frac{1}{\frac{1}{r_{in}} + j\omega C_{in}} \right) \approx g_m(r_{in}) \quad (5)$$

As seen, in this case, the next-to-last term approaches $g_m(r_{in})$ as $r_{in}$ approaches zero, since $1/r_{in}$ will be much larger than $j\omega C_{in}$.

The invention claimed is:

1. A heterojunction bipolar transistor device for operation as a field-effect transistor device which is responsive to an input voltage for application to a base/gate terminal to control current flow between an emitter/source terminal and a collector/drain terminal, comprising:

a layered semiconductor heterojunction structure including a base/gate layer of a first semiconductor type disposed between an emitter/source layer of a second semiconductor type and a collector/drain layer of said second semiconductor type;

said emitter/source layer comprising a higher bandgap material than said base/gate layer;

said base/gate layer having a thickness of less than about 100 Angstroms;

an emitter/source terminal coupled with said emitter/source layer, a base/gate terminal coupled with said base/gate layer, and a collector/drain terminal coupled with said collector/drain layer;

whereby, application of said input voltage to said base/gate terminal is operative to control current flow between said emitter/source and said collector/drain.

2. The device as defined by claim 1, wherein said first semiconductor type is p-type, and said second semiconductor layer is n-type.

3. The device as defined by claim 1, wherein said first semiconductor type is n-type, and said second semiconductor layer is p-type.

4. The device as defined by claim 1, wherein said layered semiconductor heterojunction structure has the construction of a vertical stack of layers on a semiconductor substrate.

5. The device as defined by claim 1, wherein said input voltage is an AC voltage having a frequency of at least 100 GHz, and wherein the input impedance to said base/gate terminal has a relatively very high resistive component as compared to its reactive component at the frequency of said AC voltage.

6. The device as defined by claim 5, wherein said resistive component is at least an order or magnitude greater than said reactive component at the frequency of said AC voltage.

7. The device as defined by claim 1, wherein said base/gate layer and said collector/drain layer also comprise respective materials having different bandgaps.

8. The device as defined by claim 4, wherein said base/gate layer and said collector/drain layer also comprise respective materials having different bandgaps.

9. The device as defined by claim 1, wherein said base/gate layer is highly doped.

10. The device as defined by claim 1, wherein said base/gate layer is doped to a doping concentration of at least $10^{19}/cm^3$.

11. The device as defined by claim 1, further comprising at least one layer, within said base/gate layer, that exhibits quantum size effects.

12. The device as defined by claim 7, further comprising at least one layer, within said base/gate layer, that exhibits quantum size effects.

13. The device as defined by claim 11, wherein said at least one layer that exhibits quantum size effects comprises a quantum well layer.

14. The device as defined by claim 1, wherein said base/gate layer is compositionally graded.

15. A field-effect transistor device, comprising:
a semiconductor heterostructure comprising, in a vertically stacked configuration, a semiconductor gate layer between semiconductor source and drain layers, said layers being separated by heterosteps;
said gate layer having a thickness of less than about 100 Angstroms; and
source, gate, and drain electrodes respectively coupled with said source, gate, and drain layers.

16. The device as defined by claim 15, wherein said gate layer is p-type semiconductor, and said source and drain layers are n-type semiconductor.

17. The device as defined by claim 15, wherein said source and drain layers are p-type semiconductor, and said gate layer are n-type semiconductor.

18. The device as defined by claim 15, wherein said gate layer is highly doped.

19. The device as defined by claim 15, wherein said gate layer is doped to a doping concentration of at least $10^{19}/cm^3$.

20. The device as defined by claim 15, wherein said input voltage is an AC voltage having a frequency of at least 150 GHz, and wherein the input impedance to said base/gate terminals has a relatively very high resistive component as compared to its reactive component at the frequency of said AC voltage.

21. The device as defined by claim 20, wherein said resistive component is at least an order or magnitude greater than said reactive component at the frequency of said AC voltage.

22. The device as defined by claim 15, further comprising at least one layer, within said gate layer, that exhibits quantum size effects.

23. A method for operating a transistor device as a field-effect transistor device which is responsive to an input voltage for application to a base/gate terminal to control current flow between an emitter/source terminal and a collector/drain terminal, comprising steps of:
providing a layered semiconductor heterojunction structure including a base/gate layer of a first semiconductor type disposed between an emitter/source layer of a second semiconductor type and a collector/drain layer of said second semiconductor type; said emitter/source layer comprising a higher bandgap material than said base/gate layer; and said base/gate layer having a thickness of less than about 100 Angstroms;
providing an emitter/source terminal coupled with said emitter/source layer, a base/gate terminal coupled with said base/gate layer, and a collector/drain terminal coupled with said collector/drain layer; and
applying said input voltage to said base/gate terminal to control current flow between said emitter/source and said collector/drain.

24. The method as defined by claim 23, wherein said step of providing a layered semiconductor heterojunction structure comprises depositing a vertical stack of layers on a semiconductor substrate.

25. The method as defined by claim 23, wherein said step of applying an input voltage to said base/gate terminal comprises applying an AC voltage, and further comprising providing said base/gate layer such that the input impedance to said base/gate terminal has a relatively very high resistive component as compared to its reactive component at the frequency of said AC voltage.

26. The method as defined by claim 25, wherein said resistive component is at least an order or magnitude greater than said reactive component at the frequency of said AC voltage.

27. The method as defined by claim 25, wherein said AC voltage has a frequency of at least 100 GHz.

28. The method as defined by claim 23, wherein said step of depositing layers includes depositing said base/gate layer and said collector/drain layer with respective materials having different bandgaps.

* * * * *